United States Patent Office 3,594,175

Patented July 20, 1971

3,594,175

PHOTOSENSITIVE ACETYLENIC POLYMERS

Allan S. Hay, Schenectady, N.Y., assignor to General Electric Company

No Drawing. Continuation-in-part of abandoned application Ser. No. 624,202, Mar. 20, 1967. This application Oct. 1, 1968, Ser. No. 764,287

Int. Cl. G03c 1/68

U.S. Cl. 96—115 22 Claims

ABSTRACT OF THE DISCLOSURE

Polymeric compositions containing acetylenic groups and a photosensitizing agent, which may be part of the polymer molecule or an additive to the polymer, and which upon absorbing actinic radiation, accelerates the cross-linking of the polymer, are rendered insoluble when exposed to ultraviolet irradiation, thereby making them suitable as photoresists in the graphic arts.

This application is a continuation-in-part of my copending, but since abandoned application, Ser. No. 624,202, filed Mar. 20, 1967 and assigned to the same assignee as the present invention.

This invention relates to photosensitive polymeric compositions containing acetylenic groups and a photosensitizer, which upon absorbing actinic radiation, accelerates the cross-linking of the polymer. The photosensitizer can be either part of the polymer molecule or can be a separate material which is added to the polymer. These compositions are sensitive to any form of actinic radiation, for example, normal light, but are extremely sensitive to ultraviolet light, i.e., actinic radiation having wavelengths from 300 to 4,000 angstroms and especially ultraviolet light having those wavelengths which the particular photosensitizer in the polymeric compositions strongly absorbs which usually is in the region of wavelengths between 2,000 to 4,000 angstroms, and generally is in the region of 3,000 to 4,000 angstroms, but in some cases can even extend into the visible spectrum, i.e., up to 4,500 angstroms. These wavelengths also correspond to the wavelengths of ultraviolet light which are readily available from the conventional sources. The absorption of this light by the photosensitizer initiates a photochemical reaction or series of reactions which cause the acetylenic polymer to cross-link and become insoluble in solvents in which it previously was soluble. If certain portions of the acetylenic polymer have not been exposed, for example, by masking, by focusing or projection techniques, etc., the unexposed areas can be dissolved leaving behind the exposed areas of the polymer as an accurately reproduced pattern or design.

Photosensitive polymeric compositions which can be used to form a film upon a substrate and thereafter rendered insoluble by exposing to actinic radiation are useful as photoresist materials for the preparation of printed circuits, the etching of metal printing plates, electromachining, chemical milling, etc. With the development of miniature circuits, and especially the so-called microcircuits, the necessity to have photoresist materials capable of producing very fine lines which are closely spaced together in the electrical circuit without any short circuiting between the elements or opening of the circuit and to do this reproduceably has become of extreme importance.

Many of the polymeric compositions used as photoresists depend upon a cross-linking reaction between a metal salt and the hydroxyl groups of the polymer for the development of insolubility of the exposed area. Since even the cross-linked portion of the polymer contains hydroxyl groups, swelling of the cross-linked polymer occurs, when the unexposed areas are dissolved off, which produces problems and variations which make it extremely difficult to make miniature circuits. Other polymers useful for photoresist materials depend upon the polymer containing groups which are decomposed by the actinic radiation. Such compounds are not readily available, very expensive to make, and difficult to reproduce so that they have equal photosensitivity from batch to batch. Furthermore, the decomposition reaction which is caused by actinic radiation likewise can occur due to heat, therefore, extreme care must be used in handling and using such compositions. Other compositions depend upon the polymerization of an ethylenically unsaturated monomer in the composition for the production of the cross-linking and insolubilization of exposed areas. Generally, these polymerization reactions require long exposures to produce the desired insolubilization of the exposed areas and volatilization of the monomer from the composition is difficult to control.

Even the best prior art compositions have the undesirable feature of producing rounded rather than sharp, square corners which is particularly noticeable and undesirable at the high resolution required in the making of miniature circuits by photomechanical means. Furthermore, these materials require the use of relatively mild etchants, since the stronger etchants will chemically attack them. This has seriously hindered the development of certain devices which require the use of strong etchants in the photomechanical process.

I have discovered that the acetylenic polymers disclosed and claimed in my application, Ser. No. 239,315, filed on Nov. 21, 1962, now U.S. Pat. 3,300,456, under long term exposure to ultraviolet light, which can be any light, for example, visible light containing ultra-violet light, will be cross-linked. However, due to the long time required to cause this cross-linking reaction, they are generally not suitable for use as a photoresist material. I have discovered further that these polymers can be made very photosensitive, i.e., will be cross-linked in a matter of seconds by exposure to a source of actinic radiation, especially ultraviolet light by incorporating therein, a photosensitizer, which upon absorbing actinic radiation, accelerates the cross-linking of the polymer. This photosensitizer can be either a separate material which is mixed with and preferably soluble in the polymer or it can be a moiety in the polymer molecule.

The only requirement of the photosensitizer is that it must be capable of absorbing the actinic radiation to which it is exposed and be capable of using the energy so absorbed to accelerate the cross-linking of the polymer in which it is incorporated. I have determined that a wide variety of materials are suitable as photosensitizers for the acetylenic polymers of this invention. They may be dyes, for example, rose bengal, eosine, methylene blue, acridine yellow, crystal violet, etc. They can be nitrogen containing aromatic compounds, for example, nitrobenzene, m-dinitrobenzene, azobenzene, benzenedisulfonylazide, etc., or iodoaromatic compounds, for example, iodobenzene, p-diiodobenzene, including dyes which contain iodine, for example 2′,4′,5′,7′-tetraiodofluorescein. They can be complex compounds, for example, hemoporphyrin, etc., or simple compounds, for example, anthracene, fluorene, etc.

By far the widest group of compounds are the carbonyl containing compounds containing at least one aryl ring directly attached to the carbonyl group. These compounds include ketones, aldehydes, anhydrides, quinones, etc. They may have various substituents on the aryl ring, for example, alkyl, aryl, halogen, amino, nitro, azo, etc. Hydroxyl substituents can be present but not on the position ortho to the carbonyl group. The ketones can be either a diaryl ketone, i.e., benzophenone, various ortho, meta and para substituted derivatives thereof, e.g., Michler's ketone, etc., benzil and various ortho, meta and para substituted derivatives thereof, alkyl aryl ketones, for example acetophenone, propiophenone, isobutyrophenone, diacetylbenzene, chalcone, acetylnaphthalene, acetylanthracene, benzoin and the various substituted derivatives including ethers, thereof, etc. Acetophenone and benzophenone are the two most readily available, representative members of this family of photosensitizing ketones and are very effective for my purpose. Therefore, they are the two ketones I prefer when it is desired to use a ketonic sensitizer. Certain aliphatic diketones, for example diacetyl are also effective but generally not as effective as the aromatic ketones. Examples of aldehydes and anhydrides are terephthalaldehyde, maleic anhydride, etc. The quinones may be either monocyclic or polycyclic, for example, benzoquinone, chloranil, diphenoquinone, 3,3′-dimethyl-5,5′-diphenyl diphenoquinone, etc.

A very effective photosensitizer is 1,4-diethynylbenzene. It is very effective when added per se to the acetylenic polymer, but becomes extremely so when copolymerized with other diethynyl compounds to produce the acetylenic polymers of this invention as will be discussed in more detail in the discussion of the acetylenic polymers. This increased activity of the photosensitizer when it is part of the polymer molecule is also noted, but not quite so dramatically, for ketones, for example by making the acetylenic polymers from dipropargyl ethers of dihydroxy aryl ketones as will also be discussed later.

From what has been said above it is very clear that a wide variety of materials, whose only common denominator is their ability to act as photosensitizers, i.e., they absorb light energy, usually in the ultraviolet region and are capable of transferring this absorbed energy to the acetylenic polymer with which they are in contact or in which they are incorporated as part of the polymer molecule to cause the polymer to undergo a cross-linking reaction due to this energy transfer. As is to be expected, the efficiency of the photosensitizers, which are not part of the polymer molecule, to transfer the absorbed actinic radiation to the polymer is dependent on whether the photosensitizer itself will undergo reaction due to the absorbed energy. To be most effective they should absorb actinic radiation in that part of the spectrum where the polymer itself does not absorb and this part of the spectrum should be used when exposing the photosensitive compositions. These photosensitizers, their properties and requirements are well known and are discussed in books, for example, "Molecular Photochemistry" by N. J. Turro, W. A. Benjamin, Inc., New York, 1965 and "Photochemistry" by J. G. Calvert and J. N. Pitts, Jr., John Wiley & Sons, Inc., New York, 1966.

Only a small amount of any of these photosensitizers needs to be used, i.e., in the range of 0.1 to 10% by weight. The exact amount depends on the efficiency of each ketone to transfer its absorbed light energy to the polymer and the desired speed of the resulting photoinitiated cross-linking reaction.

In general, the acetylenic polymers which can be used either as homopolymers or copolymers in conjunction with the separately added photosensitizers are the acetylenic polymers having the formula (I) $$H\left[C\equiv C\left(CH_2O\right)_m R\left(OCH_2\right)_m C\equiv C\right]_n H$$

where $m$ is 0 or 1 and $n$ is an integer and is at least 10. When $m$ is 0, the acetylenic polymers are polymers of diethylnylalkanes(alkadiynes), diethynylarenes or diethynylhaloarenes, i.e., R is alkylene, arylene, which includes alkyl substituted arylene, or haloarylene, which includes alkyl substituted haloarylene. The diacetylenic monomers of the alkylene series are readily made by reaction of sodium acetylide and the alkylene dihalide. The diacetylenic monomers of the arylene and haloarylene series are readily made by halogenation followed by dehydrohalogenation of the corresponding divinylarenes, e.g., divinylbenzenes, divinyltoluenes, divinylnaphthalenes, etc., or diacetylarenes, diacetylbenzenes, diacetyltoluenes, diacetylxylenes, diacetylnaphthalenes, diacetylanthracenes, etc. Halogenation can be carried out so that halogenation of the nucleus as well as the side chain occurs.

Typical examples of these diethynylalkanes and diethynylarnes are 1,4-pentadiyne, 1,5-hexadiyne, 1,7-octadiyne, 1,11-dodecadiyne, 1,17-octadecadiyne, etc., the diethynylbenzenes, for example, o-diethynylbenzene, m-diethynylbenzene, p-diethynylbenzene, the diethynylnaphthalenes, the diethynylanthracenes, etc., including those compounds where one or more hydrogens of the arylene group are substituted with a lower alkyl group or halogen, for example, diethynyltoluenes, diethynylxylenes, diethynylbutylbenzenes diethynylmethylnaphthalenes, diethynylmethylanthracenes, diethynylchlorobenzenes, diethynyldichlorobenzenes, diethynylbromobenzenes, diethynylchloronaphthalenes, diethynylchloroanthracenes, etc.

When $m$ is 1, the acetylenic polymer is a polymer of a dipropargyl ether of a dihydric phenol, i.e., R is arylene which includes alkyl substituted arylenes, haloarylene which includes alkyl substituted haloarylane, or $$—R'—X—R'—$$

where R′ is phenylene, lower alkyl substituted phenylene or halophenylene and X is —O—, $$—\overset{\overset{O}{\|}}{\underset{\underset{O}{\|}}{S}}—$$

or $$—\overset{\overset{R''}{|}}{\underset{\underset{R''}{|}}{C}}—$$

where R″ is hydrogen or lower alkyl. The dipropargyl ethers are readily prepared by reacting the dihydric phenol with a propargyl halide in the presence of a base, e.g., alkali metal and alkaline earth metal hydroxides, carbonates, bicarbonates, etc. Since an alkali metal hydroxide reacts with the phenol to produce a salt of the phenol, the preformed alkali metal salt of the dihydric phenol can also be used.

The dihydric phenols, which can be used to form the dipropargyl ethers can be dihydric phenols of the benzene, naphthalene, anthracene, etc. series, for example, hydroquinone, resorcinol, catechol, the isomeric dihydroxynaphthalenes, the isomeric dihydroxyanthracenes, etc., or they can be dihydroxy substituted biphenyls or diphenyl ethers, e.g., for example, the various isomeric biphenols, for example, 2,2′-biphenol, 2,3′-biphenol, 2,4′-biphenol, 3,3′-biphenol, 3,4′-biphenol, 4,4′-biphenol, the isomeric bis(hydroxyphenyl) ethers, for example, bis(2-hydroxyphenyl) ether, bis(3-hydroxyphenyl) ether, bis(4 - hydroxyphenyl) ether, 2-(3-hydroxyphenoxy)phenol, 2-(4-hydroxyphenoxy)phenol, 3-(2 - hydroxyphenoxy)phenol 3-(4-hydroxyphenoxy)phenol, etc.

These dihydric phenols can also be the isomeric bis(hydroxyphenyl) sulfones, or the various isomeric dihydric phenols known as alkylene- or alkylidenediphenols, for example, 4,4′-isopropylidenediphenol, 2,2′-isopropylidenediphenol, 2,4′-isopropylidenediphenol, methylenediphenol, ethylenediphenol, ethylidenediphenol, 4,4′-(isopropylethylene)diphenol, etc.

Any of the above dihydric phenols can be substituted by halogen or a lower alkyl group, i.e., 1 to 8 carbon atoms, typical examples which are chlorohydroquinone, bromohydroquinone, tetrachlorohydroquinone, methylhydroquinone ethylhydroquinone, isopropylhydroquinone, butylhydroquinone, pentylhydroquinone, hexylhydroquinone, including cyclohexylhydroquinone, heptylhydroquinone, octylhydroquinone, etc., the corresponding halo and alkyl substituted catechols and resorcinols, etc., the halogen and lower alkyl substituted biphenols, the halogen and lower alkyl substituted bis(hydroxyphenyl) ethers, the halogen and lower alkyl substituted bis(hydroxyphenyl) sulfones, the halogen and lower alkyl substituted alkylene- and alkylidenebiphenols, etc.

It is also possible to use acetylenic polymers or copolymers in which the acetylenic polymer itself contains a ketone group adjacent to an aryl group. In this case, the ketone group in the acetylenic polymer itself, photosensitizes the composition, so that it is not necessary to mix such a polymer with a photosensitizer although this may be done if desired. Such compositions are more photosensitive than when the ketone sensitizer is added as a separate component of the photosensitive composition. These acetylenic polymers containing such a ketone group are dipropargyl ethers of the photosensitizing ketones mentioned above. For example, they can be dipropargyl ethers of dihydric phenols which contain a ketone group separating two aryl groups, for example, the dihydroxybenzophenones examples of which are 2,2′-dihydroxybenzophenone, 2,3′-dihydroxybenzophenone, 2,3-dihydroxybenzophenone, 2,4′-dihydroxybenzophenone, 3,3′-dihydroxybenzophenone, 3,4′-dihydroxybenzophenone, 4,4′-dihydroxybenzophenone, 2,3′-dihydroxybenzophenone, 2,4′-dihydroxybenzophenone, 2,4-dihydroxybenzophenone, 3,4′-dihydroxybenzophenone, 3,4-hydroxybenzophenone, the dihydroxybenzils, and dihydroxyphenyl naphthyl ketones, the phenyl dihydroxynaphthyl ketones, the hydroxyphenyl hydroxynaphthyl ketones, etc., and these same aryl ketones containing 1 or more halogens or lower alkyl substituents on the aryl group, examples of which are given above.

Likewise, these acetylenic polymers can be dipropargyl ethers of alkylcarbonyl substituted dihydric phenols. The alkylcarbonyl substituted dihydric phenols can be any dihydric phenol, numerous examples of which are given above, which also contains one or more alkylcarbonyl (acyl) substituents. For example, 2,4-dihydroxyacetophenone, 2,3-dihydroxyacetophenone, 2,5-dihydroxyacetophenone, 2,4-dihydroxypropiophenone acetylbiphenols, diacetylbiphenols, etc. All of these diacetylenic polymers containing a ketone group are represented by the general formula (II) $$H\!-\!\left[C{\equiv}C{-}CH_2O{-}R^a{-}OCH_2{-}C{\equiv}C\right]_n\!-\!H$$

where $n$ has the value defined above and $R^a$ is one of the formulae $$-R^b-\overset{\displaystyle O}{\overset{\|}{C}}-R^b-$$

and $$\begin{array}{c}-R^c-\\ |\\ C{=}O\\ |\\ R^d\end{array}$$

where $R^b$ is arylene, $R^c$ is arenyl (i.e., trivalent arene) and $R^d$ is aryl and alkyl, numerous examples of which are given above.

Homopolymers or copolymers of the above acetylenic monomers containing a ketonic carbonyl group can be used for my process. Likewise, copolymers can be used which are made from both acetylenic monomers containing and those not containing a ketonic carbonyl group. The latter copolymers also are photosensitive, per se, since the ketonic group in the copolymer molecule is sufficient for the purpose even when the amount of the ketonic carbonyl-containing monomer incorporated into the polymer is only a very minor amount, i.e., in the order of 0.1 to 5%. Larger amounts, of course, can be used.

Another class of polymers which are photosensitive per se, i.e., need no additional photosensitizer, are the polymers of diethylnylalkanes and p-diethynylarenes copolymerized with dipropargyl ethers previously described. The photosensitivity of the dipropargyl ethers which themselves are photosensitive will be enhanced by being copolymerized with the diethynylalkanes or p-diethynylarenes but such compositions are included in the previously described photosensitive compositions. This leaves as the remaining class of photosensitive compositions of this invention, the copolymers of one or more dipropargyl ethers of dihydric phenols which do not contain a ketonic carbonyl group and one or more diethynylalkanes or 1,4-diethynylarenes. Such copolymers can be described as copolymers comprising at least 10 repeating units having both the formulae $$\left[C{\equiv}{-}CH_2{-}O{-}R^f{-}O{-}CH_2{-}C{\equiv}C\right]$$

and $$\left[C{\equiv}C{-}R^g{-}C{\equiv}C\right]$$

where $R^f$ is as previously defined in Formula I for R when $m$ is 1 and $R^g$ is alkylene or p-arylene. Typical examples of the dipropargyl ethers of dihydric phenols and diethynylalkanes within the scope of the above formulae have been given above. Typical examples of the p-diethynylarenes are any of the diethynylarenes named above wherein the two ethynyl groups are in the para positions on the same arene ring, for example, 1,4-diethynylbenzene, 1,4-diethynylnaphthalene, 9,10-diethynylanthracene, etc. Other substituents, for example, alkyl, aryl, halogen, etc. may be in any of the unsubstituted positions on the ring. Surprisingly enough, diethynylarenes wherein the two ethynyl groups are in other than para relationship to each other, for example, 1,3-diethynylbenzene, 8,10-diethynylanthracene, etc., although suitable for making copolymers do not increase the photosensitivity. The effect of the 1,4-diethynylbenzene in increasing the photosensitivity of the copolymers is considerably greater than the diethynylalkanes and the other p-diethynylarenes. Since it is the most readily available and outstanding in its ability to make photosensitive copolymers, the preferred diethynylarene is 1,4-diethynylbenzene (p-diethynylbenzene).

The above acetylenic monomers are readily converted to the desired acetylenic polymers, either homopolymers or copolymers by reacting them with oxygen in the presence of a basic-cupric-amine complex as disclosed and claimed in my copending above-mentioned U.S. Pat. 3,300,456, which is incorporated by reference. Specific details are given later in Examples 2 and 3. The acetylenic groups of the monomers are not destroyed during the polymerization process, which is actually an oxidative coupling reaction in which the hydrogens on the terminal acetylenic groups of the monomer are removed and oxidized to water and the acetylenic group of one monomer unit is joined to the acetylenic group of another monomer unit. Monoacetylenic compounds, e.g., phenylacetylene, methylacetylene, etc., can be used as chain stoppers to modify and control the molecular weight.

In order to use these compositions, for example, as a photoresist, the polymer or copolymer is dissolved in a suitable solvent along with the photosensitizing ketone if one is required. In order to produce a film of suitable properties, the degree of polymerization, i.e., the average number of units of monomer in the polymer molecule represented by $n$ in the above formulae should be at least 10, but can be any value higher than this. These solutions are used to cast a film on the substrate and then exposed to actinic radiation using a mask or other suitable means if it is desired to protect certain areas from exposure. If the light used for irradiation is rich in ultraviolet, for example, a carbon arc or mercury vapor lamp, an exposure of only a few seconds is required. Exposure to light such as that from fluorescent lights which is somewhat weaker in ultraviolet light will require a longer exposure. After exposure, the unexposed area is dissolved leaving the exposed portion as an insoluble protective layer which is extremely chemically resistant so that the substrate can now be etched, even with the strong etchants which are deleterious to the prior art materials, electromachined, plated with metal, or any other desired operation performed. After this operation, the exposed polymer may be removed either by abrasion or by long term exposure to the solvent, preferably heated, which causes the film to separate from the substrate even though it does not dissolve. If desired, the substrate may again be coated with these photosensitive compositions to produce a second pattern on the substrate by repeating the above operation.

The acetylenic polymers can be thermally decomposed to carbon films. The decomposition temperature varies from polymer to polymer. Since the carbon films so produced are electrically conductive, the photochemically produced patterns can also be used to produce electrically conductive circuits.

Many of the homopolymers are soluble in chlorinated hydrocarbons, for example, chloroform, trichloroethylene, dichloroethane, tetrachloroethane, chlorobenzene, chlorotoluene or other highly polar solvents, for example, nitrobenzene at room temperature, but some require elevated temperatures. Some of the polymers especially those from dipropargyl ethers of unsymmetrical biphenols or alkylidene biphenols are even soluble in aromatic hydrocarbons, for example, benzene, toluene and xylene. Those acetylenic monomers that form polymers which are not soluble, can be used to form soluble copolymers by copolymerizing them with one or more of the acetylenic monomers which produce a soluble polymer. The diethynylarenes, where the one thynyl group is para to the other are quite solvent resistant. For example, the polymer of p-diethynylbenzene itself is not soluble in any known solvent, but can be copolymerized with its isomer m-diethynylbenzene, to form copolymers containing up to 25% p-diethynylbenzene which are soluble in hot nitrobenzene or hot mixtures of nitrobenzene and chlorobenzene. More soluble copolymers can be made by copolymerizing these materials with one of the very soluble dipropargyl ethers of dihydric phenol, for example, those mentioned above which produce homopolymers soluble in aromatic hydrocarbons.

In order that those skilled in the art may better understand my invention the following examples are given by way of illustration and not by way of limitation. In all of the examples, parts are by weight unless stated otherwise.

EXAMPLE 1

This example illustrates the general procedure used for the preparation of the dipropargyl ethers of dihydric phenols. A solution of 214 g. of 2,4-dihydroxy-benzophenone (1.0 mole) in two liters of acetone was reacted with 284 g. of propargyl bromide (2.4 moles) in the presence of 332 g. of potassium carbonate (2.4 moles), by heating under reflux for 12 hours. After filtering the reaction mixture, the filtrate was evaporated to dryness on a steam bath. The residue was dissolved in diethyl ether and extracted with 5% potassium hydroxide and then washed with water. After removal of the diethyl ether, the residue was recrystallized from methanol yielding 209 g. of 2,4-dipropargyloxybenzophenone having a melting point of 76.1–77.4° C. Elemental analysis showed that this product contained 78.9% carbon and 5.1% hydrogen compared to theoretical of 78.6% carbon and 4.9% hydrogen.

Using this general procedure, the following dipropargyl ethers were prepared:

2,4-dipropargyloxyacetophenone,
2,5-dipropargyloxyacetophenone,
3,5-dipropargyloxyacetophenone,
1,4-dipropargyloxy-2,5-diphenylbenzene,
4-4′-dipropargyloxytetraphenylmethane,
4,4′-dipropargyloxybenzophenone,
2,2′-dipropargyloxybenzophenone,
4,4′-dipropargyloxy-3,3′,5,5′-tetraphenylbiphenyl,
4,4′-dipropargyloxy-3,3′-diphenylbiphenyl,
1,6-dipropargyloxynaphthalene,
2,2-bis(4-propargyloxyphenyl)propane,
2,2′-dipropargyloxybiphenyl and
2,2-bis(3,5-dichloro-4-propargyloxyphenyl)propane.

The following two examples illustrate the polymerization of the acetylenic monomers to the acetylenic polymers and copolymer. In general, two procedures can be used, one in which all of the monomeric diacetylenic compound is added at the beginning of the reaction and the second in which the monomeric diacetylenic compound is added dropwise over a period of time. The latter method has certain advantages when preparing copolymers. Any difference in rate of polymerization of the monomeric materials which would tend to produce blocks of the faster polymerizing monomer at the start of the polymerization if all the monomers were present at the beginning, is compensated to produce a more uniform distribution of all of the monomeric units in the polymer molecule. When the purpose of producing the copolymer is to produce a more soluble polymeric composition, it is desirable to have the solubilizing monomeric units of the copolymer distributed as uniformly as possible in the polymer molecule.

EXAMPLE 2

The following illustrates the general method of adding all of the monomeric acetylenic compound at the beginning of the polymerization reaction. A solution of 0.59 g. of cuprous chloride was dissolved in 125 ml. of pyridine in a 250 ml. Erlenmyer flask immersed in a 25° C. water bath. Oxygen was passed through the vigorously stirred solution until all of the cuprous chloride was dissolved at which point 2.37 g. of m-diethynylbenzene was added. A vigorous exothermic reaction occurred, so that in 14 minutes the temperature had risen to 40° C., and a precipitate of the polymer formed in the reaction mixture. The reaction was continued for 2 minutes longer. The polymer can be filtered from the reaction mixture at this point. if desired with any dissolved polymer being precipitated from the filtrate with acidified methanol. The actual procedure used combined these steps. The entire reaction mixture was poured into methanol acidified with a small amount of concentrated aqueous hydrochloric acid, to precipitate any polymer still remaining in the solution. After filtering off the polymer it was washed with methanol acidified with aqueous hydrochloric acid and dried in vacuum. There was obtained 2.25 g. of an almost colorless polymer which begins to decompose at about 180° C., and gradually darkens as the temperature is raised. Elemental analysis showed that the polymer contained 96.4% carbon and 3.5% hydrogen compared to theoretical values of 96.75% carbon and 3.25% hydrogen. The polymer is soluble in most organic aromatic solvents such as chlorobenzene, nitrobenzene, chlorinated hydrocarbons, such as, s-tetrachloroethane, above 100° C. A tough transparent film having a tensile strength of 8000 p.s.i. was prepared by evaporating a nitrobenzene solution of the polymer at 170° C.

Since the purpose of the pyridine is to form a complex with cuprous chloride as well as to act as a solvent for the starting materials, only enough pyridine needs to be added to complex the cuprous chloride with another solvent, for example, nitrobenzene being substituted for the balance of the pyridine. For example, I have carried out the above polymerization reaction using a mixture of 35 ml. of pyridine and 90 ml. of nitrobenzene in place of the 125 ml. of pyridine. Likewise, other amines can be used in place of or in conjunction with the pyridine either alone or in admixture with another solvent. A particular effective amine is N,N,N′,N′-tetramethylethylenediamine which gives even a faster reaction than pyridine.

EXAMPLE 3

The following method demonstrates the general method which is particularly used for making copolymers, but also can be used to prepare homopolymers.

A solution of 1 g. of cuprous chloride and 1.5 ml. of N,N,N′,N′-tetramethylethylenediamine in 20 ml. of a mixed solvent system of 70% of nitrobenzene and 30% pyridine was prepared in an 250 ml. Erlenmyer flask heated in a 40° C. water bath. Oxygen was passed through the stirred solution while a solution of 0.5 g. of m-diethynylbenzene and 0.5 g. of 1,8-nonadiyne in 20 ml. of a mixed solvent system of 70% nitrobenzene and 30% pyridine was added dropwise over a period of 45 minutes. The reaction was allowed to continue for an additional 25 minutes. Since the polymer remained in solution, it was precipitated by pouring the mixture into excess methanol acidified with a small amount of concentrated hydrochloric acid. After removing the polymer by filtration, it was washed with additional methanol containing a small amount of hydrochloric acid and then dried. This polymer was readily soluble in chloroform at room temperatures. Films were prepared by spreading the film on a substrate and evaporating the solvent.

Utilizing the methods described above in Examples 2 and 3, the following homopolymers and copolymers were prepared from the stated monomers. The solvent given in parentheses are typical of the solvents in which the particular polymer was soluble and can be used to prepare solutions for the casting of films. The solvents listed are not the only solvents that can be used. The choice of a particular solvent is merely one of convenience and not a critical part of the invention.

Monomers used for homopolymers m-diethynylbenzene (hot nitrobenzene)
1,8-nonadiyne (chloroform)
1,6-heptadiyne (chloroform)
2,2′-dipropargyloxybiphenyl (tetrachloroethane)
4,4′-dipropargyloxy-3,3′,5,5′-tetraphenylbiphenyl (chloroform)
4,4′-dipropargyloxy-3,3′-diphenylbiphenyl (tetrachloroethane)
2,2′-dipropargyloxybenzophenone (chloroform)
4,4′-dipropargyloxybenzophenone (chlorofrom)
2,4-dipropargyloxybenzophenone (chloroform)
2,2-bis(4-propargyloxyphenyl)propane, i.e., the dipropargyl ether of 4,4′-isopropylidenediphenol (chloroform, tetrachloroethane)

Monomers used for copolymers

80% m-diethynylbenzene, 20% 4,4′-dipropargyloxybenzophenone (tetrachloroethane, chloroform)
80% m-diethynylbenzene, 20% 2,2′-dipropargyloxybenzophenone (tetrachloroethane)
80% m-diethynylbenzene, 20% 2,2-bis(4-propargyloxyphenyl)-propane (tetrachloroethane)
50% m-diethynylbenzene, 50% 4,4′-dipropargyloxy-3,3′-diphenylbiphenyl (tetrachloroethane)
50% 2,4-dipropargyloxybenzophenone, 50% 2,2-bis(4-propargyloxyphenol)pentane (toluene, tetrachloroethane)
50% 2,4-dipropargyloxyacetophenone, 50% 2,2-bis(4-propargyloxyphenyl)pentane (chloroform, toluene)
75% m-diethynylbenzene, 25% p-diethynylbenzene (hot nitrobenzene)
34% m-diethynylbenzene, 66% 2,4-dipropargyloxyacetophenone (tetrachloroethane)
50% m-diethynylbenzene, 50% 2,4-dipropargyloxyacetophenone (tetrachloroethane)
80% m-diethynylbenzene, 20% 2,4-dipropargyloxybenzophenone (hot tetrachloroethane)
70% m-diethynylbenzene, 30% 4,4′-dipropargyloxy-3,3′,5,5′-diphenylbiphenyl (tetrahydrofuran)
64% m-diethynylbenzene, 36% 2,4-dipropargyloxybenzophenone (tetrachloroethane)
50% m-diethynylbenzene, 50% 2,4-dipropargyloxybenzophenone (tetrachloroethane, chloroform)
74% m-diethynylbenzene, 24% 2,4-dipropargyloxybenzophenone, 2% phenylacetylene (chloroform)
63% m-diethynylbenzene, 35% 2,4-dipropargyloxybenzophenone, 2% phenylacetylene (chloroform).

EXAMPLE 4

This example illustrates the use of the photosensitive compositions which require the addition of a photosensitizer. The monomer, 2,2 - bis(4 - propargyloxyphenyl)-propane, the dipropargyl ether of 4,4′ - isopropylidendiphenol, was prepared as described in Example 1. This monomer was polymerized as described in Example 3 to give a polymer having the formula

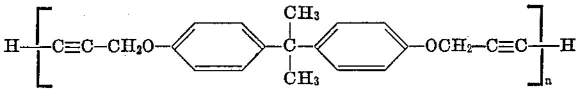

where *n* is an previously defined. Three solutions of this polymer were made using chloroform as the solvent. One solution contained 1 g. of the polymer per 100 ml. of solvent. The second solution contained 0.95 g. of the polymer and 0.05 g. of benzophenone per 100 ml. of solvent. The third solution was the same as the second but contained acetophenone in place of the benzophenone. Films were cast from each of these solutions and exposed to the ultraviolet light from a 1000 watt, water cooled, quartz jacketed, mercury vapor lamp. The film not containing the photosensitizing ketone was not completely insolubilized and cross-linked after an exposure of 2 minutes at a distance of six inches from the lamp. However, the other two films, the one containing benzophenone and the other acetophenone, were completely insoluble and cross-linked after an exposure of only 20 seconds at a distance of 6 inches from the lamp.

Table I shows a wide variety of photosensitizers which were used in place of the benzophenone or acetophenone in this example and the corresponding times in seconds required to cross-link the polymer so that it was no longer soluble in the solvents in which it previously could be dissolved. The concentration used in all cases was 10% by weight of the total weight of polymer and photosensitizer.

TABLE I

| Photosensitizer: | Time, sec. |
|---|---|
| None | 120 |
| 10% p-diethynyl benzene | 20–30 |
| 10% hemoporphyrin | 20–30 |
| 10% 2′,4′,5′,7′-tetraiodofluoroescein | 20–30 |
| 10% rose bengal | 20–30 |
| 10% 2,6-dibenzylidenecyclohexanone | 30 |
| 10% 3,3′-dimethyl-5,5′-diphenyldiphenoquinone | 30 |
| 10% p-diiodobenzene | 30 |
| 10% p-benzoquinone | 40 |
| 10% chalcone | 40 |
| 10% terephthalaldehyde | 40 |
| 10% maleic anhydride | 40 |
| 10% m-dibenzoylbenzene | 40 |
| 10% 3,3′-diphenyl-5,5′-distyryl diphenoquinone | 40 |
| 10% 3,3′-dimethyl-5,5′-distyryl diphenoquinone | 40 |
| 10% chloranil | 50 |
| 10% anthracene | 50 |
| 10% methylene blue | 60 |
| 10% azobenzene | 60 |
| 10% m-dinitrobenzene | 60 |
| 10% m-benzenedisulfonylazide | 60 |
| 10% diacetyl | 70 |
| 10% eosin B | 70 |
| 10% ethyl butyl ketene | 70 |

A film of a copolymer prepared from 90% 2,2-bis(4-propargyloxyphenyl)propane and 10% 4,4′-dipropargyloxy-3,3',5,5'-tetraphenylbiphenyl also required an exposure of greater than two minutes whereas when 1% benzophenone or 1% acetophenone were incorporated into the film, the exposure was reduced to 40 seconds in the case of acetophenone and 50 seconds in the case of benzophenone. This copolymer contains

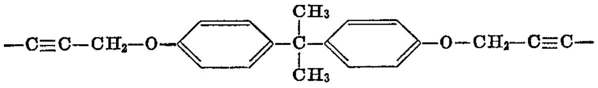

units interspersed with

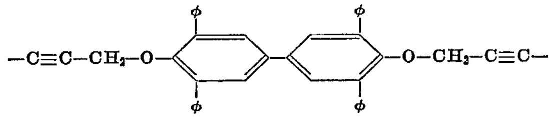

units in the polymer molecule where ϕ— represents phenyl.

A copolymer prepared from 50% m-diethynylbenzene and 50% 1,8-nonadiyne having both

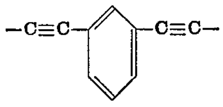

units and $$-C\equiv C-(CH_2)_5-C\equiv C-$$

units in the polymer molecule, although having an increased photosensitivity over the homopolymer of m-diethynylbenzene, was rendered still more photosensitive and required an exposure of only 30 seconds when it contained 2% benzophenone to produce a completely insoluble, cross-linked film.

In a similar manner, a film of the copolymer prepared from 70% m-diethynylbenzene and 30% 4,4'-dipropargyloxy-3,3'5,5'-tetraphenylbiphenyl having both

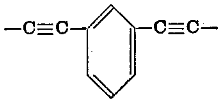

units and

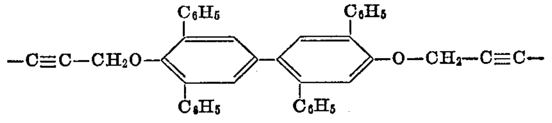

units in the polymer molecule, did not cross-link and was still soluble after a two minute exposure to a 1000 watt Pyrex glass jacketed mercury vapor lamp when the film did not contain a photosensitizer. A masked film of the same copolymer contains 13% benzophenone on a glass substrate after the same exposure, was washed with tetrahydrofuran. The unexposed areas of the film were readily dissolved while the exposed areas remained as an insoluble, cross-linked pattern on the substrate.

A solution of 15 g. of the acetylenic polymer of 2,2-bis(4-propargyloxyphenyl)propane in 100 ml. of tetrachloroethane was prepared to which was added 1.5 g. of benzophenone. This was used to coat a photoresist layer on a monocrystalline silicon wafer (cut from a single silicon crystal) having a thin silicon dioxide coating on the surface. After drying for 16 hours at 50° C., the test sample was masked with a resolution test mask and exposed for 15 minutes to the ultraviolet light from a 200 watt medium pressure mercury vapor lamp having a Pyrex brand borosilicate glass envelope. After exposure, the unexposed portion of the photoresist layer was dissolved by a 15 second immersion of the test sample in an equal volume mixture of xylene and tetrachloroethane followed by a 5 second immersion in tetrachloroethane. The exposed areas of the silicon dioxide were then dissolved down to the silicon surface with the standard etchant. Excellent reproduction of the test pattern was obtained including sharp right angle corners. Two commercially available photoresists under the same conditions produced rounded corners.

EXAMPLE 5

This example illustrates the use of acetylenic polymers containing a ketonic carbonyl group in the polymer molecule. A copolymer of 63% m-diethynylbenzene, 35.5% 2,4-dipropargyloxyacetophenone and 1.5% phenylacetylene was prepared by the method of Example 3. This copolymer contains both

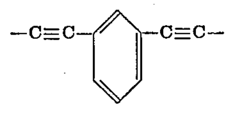

units interspersed with

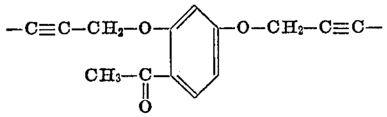

units with polymer molecule end units chain terminated with

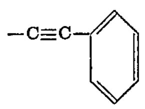

units instead of the usual hydrogen in the polymer molecule. A 1% solution of this polymer in chloroform was used to coat a monocrystalline silicon disc, a monocrystalline silicon disc having a silicon dioxide surface layer and a monocrystalline silicon disc having a silicon nitride surface layer. Each of these coated discs were covered with a mask having a multiplicity of patterns of a miniature circuit and exposed for 30 seconds to ultraviolet light from a 200 watt high pressure mercury vapor lamp. The unexposed portion of the polymer film was dissolved by immersion for 2 minutes in tetrachloroethane. An excellent reproduction of the mask pattern was obtained on each of the discs which was not chemically attacked by hydrofluoric acid etchant.

In a similar manner a monocrystalline silicon disc with the miniature circuit pattern was prepared using a copolymer of 50% 2,2-bis(4-propargyloxyphenyl)propane and 50% 2,4-dipropargyloxybenzophenone. This copolymer contains

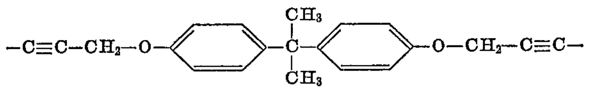

units interspersed with

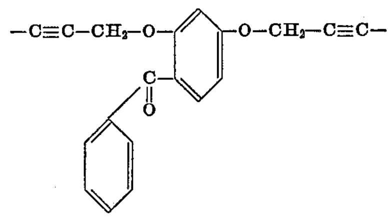

units in the polymer molecule. The photoresist layer was chemically resistant to an etchant of 1 part hydrofluoric acid, 3 parts nitric acid and 3 parts acetic acid.

Other copolymers containing ketonic carbonyl groups as part of the polymer molecule that are useful photoresists without the addition of a separate photosensitizer and their exposure times in seconds to cause cross-linking are shown in Table II.

TABLE II

| Percent monomers copolymerized | | | | | Exposure time, seconds |
|---|---|---|---|---|---|
| A | B | C | D | E | |
| 60 | | 30 | | 10 | 20 |
| | 90 | | 10 | | 20 |
| | 70 | 10 | | 20 | 20 |
| | 80 | 10 | | 10 | 30 |
| | 80 | 10 | 10 | | 30 |
| 60 | | 30 | 10 | | 30 |
| | 90 | | | 10 | 30 |
| 55 | | | | 45 | 30 |
| | 85 | | | 15 | 30 |
| 50 | | 40 | | 10 | 40 |

NOTE.—A=2,2-bis(4'-propargyloxyphenyl)propane; B=1,3-diethynylbenzene; C=4,4-dipropargyloxy-3,3',4,4'-tetraphenylbiphenyl; D=2,4-dipropargyloxyacetophenone; E=2,4-dipropargyloxybenzophenone.

Without either D or E in the copolymer the exposure time is at least two minutes.

EXAMPLE 6

This example illustrates the use of diethynylalkanes and 1,4-diethynylarenes to increase the photo-sensitivity of polymers of dipropargylethers of dihydric phenols not containing a ketonic carbonyl group. The compositions and required exposure times are shown in Table III. Without these components in the polymer the exposure time is at least 2 minutes.

TABLE III

| Percent monomer copolymerized | | | | | | Exposure time, seconds |
|---|---|---|---|---|---|---|
| A | B | C | F | G | H | |
| | 97 | | | 3 | | 10 |
| | | 97 | | 3 | | 10 |
| 56.4 | | 40 | | 3.6 | | 10 |
| | | | 97 | 3 | | 15 |
| | 99.4 | | | 0.6 | | 30 |
| | 80 | 10 | | | 10 | 40 |
| | 90 | | | | 10 | 40 |
| | 99.7 | | | 0.3 | | 50 |

NOTE.—A, B and C same as Table II; F=Bis(4-propargyloxyphenyl) diphenylmethane; G=1,4-diethynylbenzene; H=1,8-nonadiyne.

EXAMPLE 7

This example illustrates the use of p-diethynylarenes to increase the photosensitivity of polymers of dipropargyl ethers of dihydric phenols not containing a ketonic carbonyl group and also the effect of increasing the molecular weight of the polymer as measured by the intrinsic viscosity (dl./g. in tetrachloroethylene), on increasing the photosensitivity. In this example, a 200 watt, quartz-jacketed ultraviolet light contained in a black, light-tight box equipped with a shutter was used. The test discs were spun-coated with a toluene solution of the polymer. The discs were exposed at distance of approximately 10 inches from the light. The results are shown in Table IV.

TABLE IV

| Percent monomer copolymerized | | | | | Intrinsic viscosity of polymer | Exposure time |
|---|---|---|---|---|---|---|
| A | G | I | J | K | | |
| 100 | | | | | 1.0 | 6 minutes. |
| 98 | 2 | | | | .39 | 14 seconds. |
| | | | | | .72 | 7 seconds. |
| | | | | | 1.1 | 4 seconds. |
| 97 | 3 | | | | 1.0 | <1 seconds. |
| 94 | 6 | | | | .69 | 3 seconds. |
| | 3 | 97 | | | .55 | 25 seconds. |
| 97 | | | 3 | | .29 | 3.5 minutes. |
| 97 | | | | 3 | .75 | 2 minutes |

NOTE.—A same as Table I; G, same as Table II; I=2, 2-bis (4=propargyloxy=-3,5-dimethylphenyl)propane; J=1,4-diethynylnaphthalene; K=9.10 diethynylanthracene.

In a similar manner, the polymers and copolymers of Examples 2 and 3 have been found to be useful in the making of photosensitive compositions, for example, photoresist layers. Although, the above description has been in the specific examples and has been directed to the use of the compositions for the making of photoresist layers, it is obvious that these photosensitive compositions can be used in other applications in the photomechanical field. For example, they can be used to photographically reproduce a printed circuit on a blank copper clad circuit board to permit the copper to be selectively dissolved in the areas beneath the unexposed area of the photosensitive composition after dissolving off the unexposed polymer or a circuit board pattern can be produced by electroless metal plating, for example, copper plating, by well known techniques in the unexposed areas after dissolving the unexposed photosensitive compositions. These compositions can likewise be used in the production of printing plates and all other such devices as are produced by photomechanical means, whereby metal is either removed from or deposited on the substrate beneath the unexposed areas of the photoresist after removal of the unexposed polymeric photosensitive composition. These and other modifications and variations of the present invention are possible, in light of the above teachings. It is therefore to be understood that such changes may be made in the particular embodiments of the invention described which are within the fully intended scope of the invention as defined by the appended claims.

What I claim as new and desire to secure by Letters Patent of the United States is:

1. A photosensitive composition comprising a soluble, acetylenic polymeric composition selected from the group consisting of:

(a) a mixture of (1) an acetylenic polymer, having the formula $$H\left[C\equiv C\left(CH_2O\right)_m R\left(OCH_2\right)_m C\equiv C\right]_n H$$

where $m$ is one of the integers 0 and 1; $n$ is an integer and is at least 10 and R is selected from the group consisting of arylene, including lower alkyl substituted arylene, haloarylene, including lower alkyl substituted haloarylene, and, in addition, when $m$ is 0, alkylene and when $m$ is 1, —R'—X—R'— where R' is selected from the group consisting of phenylene, halophenylene and lower alkyl substituted phenylene and X is selected from the group consisting of —O—, $$-\overset{O}{\underset{O}{\overset{\|}{\underset{\|}{S}}}}- \quad \text{and} \quad -\overset{R''}{\underset{R''}{\overset{|}{\underset{|}{C}}}}-$$

where R'' is selected from the group consisting of hydrogen and lower alkyl, and (2) a photopolymerization sensitizing agent which, upon absorbing actinic radiation accelerates the cross-linking of said polymer;

(b) an acetylenic polymer having the formula $$H\left[C\equiv C-CH_2O-R^a-OCH_2-C\equiv C\right]_n H$$

where $n$ has the value defined above and $R^a$ is one of the formulae $$-R^b-\overset{O}{\overset{\|}{C}}-R^b-$$

and $$\begin{array}{c}-R^c-\\ |\\ C{=}O\\ |\\ R^d\end{array}$$

where $R^b$ is arylene, $R^c$ is arenyl and $R^d$ is alkyl and aryl;

(c) copolymers having at least 10 repeating units of the polymers of both (a) and (b); and (d) copolymers comprising at least 10 repeating units having the formulae:

$$-\left[C\equiv C-CH_2O-R^f-O-CH_2-\equiv C\right]-$$

and $$-\left[C\equiv C-R^g-C\equiv C\right]-$$

where $R^f$ is as defined above for R when *m* is 1 and $R^g$ is alkylene or p-arylene.

2. The compositions of claim 1 defined by (a).

3. The compositions of claim 1 defined by (b).

4. The compositions of claim 1 defined by (c).

5. The compositions of claim 1 defined by (d).

6. The compositions of claim 1 as defined by (a) wherein the photopolymerization sensitizing agent is a photosensitizing ketone having an aryl substituent directly attached to the carbonyl group.

7. The compositions of claim 1 as defined by (a) wherein the photopolymerization sensitizing agent is a ketone selected from the group consisting of acetophenone and benzophenone and the acetylenic polymer is the polymer of diethynylbenzene of which 0–25% is p-diethynylbenzene and the balance is m-diethynylbenzene.

8. The compositions of claim 1 as defined by (a) wherein the photopolymerization sensitizing agent is a ketone selected from the class consisting of acetophenone and benzophenone and the acetylenic polymer is the polymer of a dipropargyl ether of a dihydric phenol.

9. The composition of claim 1 as defined by (a) wherein the photopolymerization sensitizing agent is a ketone selected from the group consisting of acetophenone and benzophenone and the acetylenic polymer is a copolymer of m-diethynylbenzene and 4,4′-dipropargyloxy-3,3′,5,5′-tetraphenylbiphenyl.

10. The compositions of claim 1 as defined by (b) wherein the acetylenic polymer is the polymer of the dipropargyl ether of an acetyl substituted dihydric phenol.

11. The compositions of claim 1 as defined by (b) wherein the acetylenic polymer is the polymer of the dipropargyl ether of a dihydroxy substituted benzophenone.

12. The compositions of claim 1 as defined by (c) wherein the copolymer is a copolymer of m-diethynylbenzene and the dipropargyl ether of an acetyl substituted dihydric phenol.

13. The compositions of claim 1 as defined by (c) wherein the copolymer is a copolymer of m-diethynylbenzene and the dipropargyl ether of a dihydroxy substituted benzophenone.

14. The compositions of claim 1 as defined by (c) wherein the copolymer is a copolymer of the dipropargyl ether of 4,4′-isopropylidenediphenol and the dipropargyl ether of 2,4-dihydroxybenzophenone.

15. The compositions of claim 1 as defined by (d) wherein the copolymer is a copolymer of 1,4-diethynylbenzene and a dipropargyl ether of a dihydric phenol.

16. The compositions of claim 15 wherein the dihydric phenol is 4,4′-isopropylidenediphenol.

17. The compositions of claim 1 as defined by (d) wherein the copolymer is a copolymer of an alkadiyne and a dipropargyl ether of a dihydric phenol.

18. The compositions of claim 8 wherein the dihydric phenol is 4,4′-isopropylidenediphenol.

19. The compositions of claim 8 wherein the dihydric phenol is a biphenol.

20. The compositions of claim 12 wherein the acetyl substituted dihydric phenol is 2,4-dihydroxyacetophenone.

21. The compositions of claim 13 wherein the dihydroxy substituted benzophenone is 2,4-dihydroxybenzophenone.

22. The composition of claim 17 wherein the dihydric phenol is 4,4′-isopropylidenediphenol.

References Cited

UNITED STATES PATENTS

| | | | |
|---|---|---|---|
| 2,484,529 | 10/1949 | Roedel | 204—159.14 |
| 3,219,566 | 11/1965 | Potts et al. | 96—115X |
| 3,300,456 | 1/1967 | Hay | 260—88.2 |
| 3,375,229 | 3/1968 | Borden et al. | 260—50 |

WILLIAM D. MARTIN, Primary Examiner

T. G. DAVIS, Assistant Examiner

UNITED STATES PATENT OFFICE
CERTIFICATE OF CORRECTION

Patent No. 3,594,175 Dated July 20, 1971

Inventor(s) Allan S. Hay

It is certified that error appears in the above-identified patent and that said Letters Patent are hereby corrected as shown below:

Column 4, line 25, change "haloarylane" to -- haloarylene --. Column 5, lines 25 and 26, cancel "2,3'-dihydroxybenzophenone, 2,4'-dihydroxybenzophenone". Column 7, line 29, change "thynyl" to -- ethynyl --; line 49, change "2,4-dihydroxy-benzo-" to -- 2,4-dihydroxybenzo- --. Column 8, line 31, cancel "dissolved" and insert -- prepared --. Column 9, line 23, cancel "film" and insert -- solution --; line 60, change "propargyloxyphenol)pentane" to -- propargyloxyphenyl)pentane --. Column 10, line 48, change "p-diethynyl benzene" to -- p-diethynylbenzene --. Column 11, line 45, that portion of the formula reading

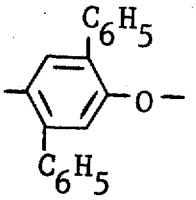

should read

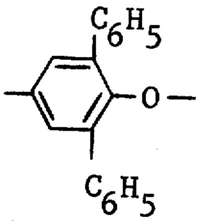

;

line 53, change "contains" to -- containing --. Column 13, Table II, in the NOTE, change "2,2-bis(4'-propargyloxyphenyl)propane" to -- 2,2-bis(4-propargyloxyphenyl)propane --; line 47, change "tetrachloroethylene" to -- tetrachloroethane --; Table IV, in the NOTE, that portion of the name reading "=2, 2-bis (4=propargyloxy=-3," should read -- =2,2-bis(4-propargyloxy-3, --; change "9.10 diethynylanthracene" to -- 9,10-diethynylanthracene --. Column 15, line 3, that portion of the formula reading $-CH_2-\equiv C\!+$ should read $-CH_2\equiv C\!+$. Column 5, line 59, and Column 14, fourth line from the bottom, "and", each occurrence, second occurrence, should read -- or --.

Signed and sealed this 16th day of May 1972.

(SEAL)
Attest:

EDWARD M.FLETCHER,JR.
Attesting Officer

ROBERT GOTTSCHALK
Commissioner of Patents